(12) United States Patent
Gotou et al.

(10) Patent No.: US 6,436,745 B1
(45) Date of Patent: Aug. 20, 2002

(54) METHOD OF PRODUCING A SEMICONDUCTOR DEVICE

(75) Inventors: Masahito Gotou; Yasumori Fukushima, both of Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 16 days.

(21) Appl. No.: 09/699,441

(22) Filed: Oct. 31, 2000

(30) Foreign Application Priority Data

Nov. 2, 1999 (JP) .......................................... 11-312236

(51) Int. Cl.[7] ................................................ H01L 21/00
(52) U.S. Cl. ........................ 438/166; 438/471; 438/486; 438/765
(58) Field of Search ................................. 438/166, 310, 438/162, 471, 476, 486, 487, 765, 764, 790, 793

(56) References Cited

U.S. PATENT DOCUMENTS 6,133,119 A * 10/2000 Yamazaki et al. .......... 438/476
6,197,626 B1 * 3/2001 Yamazaki et al. .......... 438/159

FOREIGN PATENT DOCUMENTS

| JP | 6-244103 | 9/1994 |
| JP | 10-223533 | 8/1998 |

* cited by examiner

*Primary Examiner*—Caridad Everhart
(74) *Attorney, Agent, or Firm*—Nixon & Vanderhye P.C.

(57) ABSTRACT

In a method of producing a semiconductor device, an a-Si film is crystallized using nickel to form a CGS film. Then, an a-Si film containing phosphorus is directly formed on the whole surface of the CGS film, and then the CGS film and the a-Si film are subjected to heat treatment to thereby getter the nickel from the CGS film the a-Si film. The a-Si film containing nickel and phosphorus is removed. Then, using the thus obtained CGS film for an active region, a thin-film transistor is formed.

11 Claims, 4 Drawing Sheets

METHOD OF PRODUCING A SEMICONDUCTOR DEVICE

BACKGROUND OF THE INVENTION

This invention relates to semiconductor devices such as a thin film transistor (hereinafter referred to as TFT) used for, for example, driving an active matrix liquid display device, and more particularly to a method of producing a semiconductor device having a silicon film crystallized using a so-called catalytic metal element.

Among thin-type, low power consumption liquid crystal display devices, those devices using TFTs for drive elements ensure high performance such as high contrast and high response speed. Therefore, these devices are mainly used for display portions of personal computers (PCs), portable televisions (TVs) and the like, and thus the market scale of TFTs has been expanding markedly.

Some of the TFTs use a CGS (Continuous Grain Silicon) film as a semiconductor for a channel region. As described in JP-A-6-244103, the CGS film is an Si film having excellent crystallinity, which is obtained by depositing a minute amount.of a certain metal element such as Ni on the surface of an amorphous silicon (hereinafter abbreviated to a-Si) film and then conducting a heat treatment thereof. The CGS film ensures low-power consumption and high-speed response compared with the conventional a-Si and polycrystalline silicon (hereinafter abbreviated to p-Si) films. Further, the CGS film has the advantage in that the utilization of its high mobility also permit fabrication of future sheet computers. Thus, the CGS film has been regarded as a promising film that can be used for next-generation liquid crystal display devices.

Incidentally, a CGS film obtained by the above fabrication steps contains atoms of a metal element promoting crystallization. When fabricating a TFT using the CGS film containing the metal element, the metal element acts as an impurity in Si that forms a channel region of the TFT, resulting in the occurrence of energy levels in Si. Therefore, some serious problems such as a change in the threshold voltage of the TFT with time or an increase in OFF current are caused.

In order to solve such problems, a method of removing the metal element is disclosed in JP-A-10-223533. In JP-A-10-223533, parts of the CGS film fabricated are doped with phosphorus (P), a group V element, at a high concentration and then subjected to heat treatment. Thereby, the metal element is gettered to the parts doped with P of the CGS from a region that will become a channel portion of the TFT.

Incidentally, in the method of producing a semiconductor device using the gettering method disclosed in JP-A-10-223533, the element P is selectively introduced into the CGS film and therefore it is necessary to form a mask on the CGS film. Thus, a photolithography step for forming the mask is required. As a result, there is a problem that the number of steps is increased, resulting in an increase in production cost.

Further, after the gettering of the metal element from the channel regions, because the P-doped regions contain the gettered metal element, those regions cannot be used for the fabrication of devices and thus must be removed. As a result, there occurs a limitation in the layout of semiconductor devices such as picture elements, driver elements and the like on the substrate. Accordingly, there occurs a problem that the area of the CGS film required for the production of such semiconductor devices increases, resulting in an increase in the size of the resultant apparatus incorporating those semiconductor devices.

SUMMARY OF THE INVENTION

This invention was made in view of the above problems, and an object of the invention is to provide a method of producing a semiconductor device which method performs the gettering without using any masks to thereby reduce production cost and allows reduction of the size of an apparatus incorporating the semiconductor devices produced by this method.

In order to accomplish the above object, a method of producing a semiconductor device according to the present invention comprises the steps of:

crystallizing an amorphous silicon film or a partially crystalline amorphous silicon film using a catalytic metal element promoting crystallization of silicon to form a crystalline first silicon film;

forming a second silicon film containing a group V element directly on an entire surface of the first silicon film;

subjecting the first silicon film and the second silicon film to a heat treatment to thereby getter the catalytic metal element from the first silicon film to the second silicon film; and removing the second silicon film to which the catalytic metal element has been gettered.

In the method of producing a semiconductor device of this invention, the gettering of the catalytic metal element from the crystalline first silicon film is performed using the second silicon film directly formed on the whole surface of the first silicon film, and not using parts of the first silicon film itself. That is, the method of the invention does not involve selective injection of the group V element into the first silicon film in the gettering process. Therefore, the gettering process requires no mask for selective injection of the group V element and hence no photolithography step for forming a mask. Therefore, the fabrication steps for a semiconductor device are simplified, whereby the production cost can be reduced.

Further, after removing the second silicon film to which the catalytic metal element has been gettered from the first silicon film, the catalytic metal element as an impurity is substantially not present in the first silicon film, and thus the first silicon film does not include any unusable region. Accordingly, there is no limitation in the layout of devices, such as picture elements and driver elements, so that the size of an apparatus incorporating these semiconductor devices can be reduced.

However, there are two possible problems that are inherent to the method of producing a semiconductor device in this invention, i.e., (A) diffusion of atoms of the group V element into the first silicon film, (B) method of removing the second silicon film containing the group V element. Solutions to these problems will be described below.

(A) Solution to the Diffusion of Group V Element Into the First Silicon Film In the method of producing a semiconductor device according to this invention, there is a possibility that the heat treatment of the first and second silicon films causes the group V element atoms in the second silicon film to migrate or move to the first silicon film. The group V element that has moved into the first silicon film acts as an impurity. Therefore, when fabricating a TFT as the semiconductor device using the first silicon film containing the group V element, the first silicon film containing the group V element adversely affects the properties of the TFT.

In order to prevent the group V element from diffusing into the first silicon film, the difference in diffusion constant between the group V element and the catalytic metal element is utilized. It is known that the diffusion constant within a silicon film of the group V element greatly differs from that of the catalytic element. For example, phosphorus (P) and nickel (Ni) are now selected as representatives of the group V element and the catalytic metal element, respectively. As the catalytic metal element, at least one element selected from a group consisting of Fe, Co, Ni, Cu, Ru, Rh, Pd, Os, Ir, Pt and Au may be used.

In general, the diffusion constant of P within the silicon film is calculated to be $1.47 \times 10^{-27}$ cm$^2$/sec. at 400° C., and $2.80 \times 10^{-21}$ cm$^2$/sec. at 600° C., while the diffusion constant of Ni within the silicon film is calculated to be $5.84 \times 10^{-16}$ cm$^2$/sec. at 400° C., and $1.06 \times 10^{-12}$ cm$^2$/sec. at 600° C. As described above, it turns out that, within the silicon film, the diffusion constant of Ni is larger than that of P by about 10 digits.

Based on the diffusion constants of P and Ni, two simulations are tried: (1) diffusion of P into the first silicon film; (2) gettering of Ni to the second silicon film. Conditions for the simulations are as follows. As shown in FIG. 3, P atoms make a reversible migration, or a back and forth movement between the first silicon film indicated by reference numeral 43 and the second silicon film indicated by reference numeral 44, while Ni atoms make a non-reversible migration, or a movement in one direction from the first silicon film 43 to the second silicon film 44 because Ni is gettered by P within the second silicon film. In addition, the interfacial concentration of Ni in the first silicon film 43 is $1 \times 10^{13}$ atoms/cm$^2$, while the interfacial concentration of P in the second silicon film 44m is $1 \times 10^{15}$ atoms/cm$^2$. Further, the film thickness of the first silicon film 43 is 100 nm, while the film thickness of the second silicon film 44 is set infinite because it is not required on the simulations. Further, when fabricating a TFT using the first silicon film 43, the concentrations of P atoms and Ni atoms in the first silicon film at which these atoms are considered not to adversely affect the properties of the TFT are each not more than $10^{10}$ atoms/cm$^3$.

The above conditions for the simulations are substituted for the following equations (1), (2) and (3) The equations (1), (2) and (3) are general equations for impurity diffusion.

(Diffusion Constant of P)

$$D = 3.85 \times \exp \frac{-3.66 \text{ eV}}{kt} \quad (1)$$

(Diffusion Constant of Ni)

$$D = 0.1 \times \exp \frac{-1.9 \text{ eV}}{kT} \quad (2)$$

(Equation for Calculation of Concentration)

$$C(x, t) = \frac{Qt}{\sqrt{\pi Dt}} \exp \frac{-x^2}{4Dt} \quad (3)$$

where
  t: time,
  x: depth,
  e: electron charge,
  T: temperature (unit is K: Kelvin),
  k: Boltzmann constant,
  Qt: surface concentration of element, and C (x, t): concentration at a depth of x after a lapse of time of t.

The results that were calculated using the above equations (1), (2) and (3) about the diffusion of P into the first silicon film and the gettering of Ni to the second silicon film are shown in FIG. 4 and FIG. 5, respectively. FIG. 4 is a graph showing the relationship between the concentration of P within the first silicon film 43 and the diffusion depth of P. FIG. 5 is a graph showing the relationship between the time required for the Ni concentration within the first silicon film to reduce to $10^{10}$ atoms/cm$^3$ or less and the depth from the interface of the first silicon film 43 and the second silicon film 44.

As shown in FIG. 4, when performing the heat treatment at 600° C. for 12 hours to the first and second silicon films 43, 44 (shown in FIG. 3), the concentration of P at a depth of more than 1.5 nm from the surface of the first silicon film is not more than $10^{10}$ atoms/cm$^3$. That is, P is hardly diffused at a depth of more than 1.5 nm from the surface of the first silicon film 43.

On the other hand, FIG. 5 indicates that by carrying out the heat treatment at 400° C. for 3 hours, the Ni concentration within the first silicon film 43 having a thickness of 100 nm is reduced to $10^{10}$ atoms/cm$^3$ or less, and therefore that sufficient gettering is achieved.

In this way, by performing the treatment to the first and second silicon films 43, 44 at an appropriate heating temperature for an appropriate period of time, it becomes possible to getter the catalytic metal element Ni contained in the first silicon film 43 without diffusing the group V element P contained in the upper second silicon film 44 into the first silicon film 43.

According to the calculation, the gettering can be successfully performed by the treatment at a low temperature for a long period of time such as 350° C. for 24 hours, or the treatment at a high temperature for a short period of time such as 700° C. for 10 minutes. However, in the practical steps, a longer treatment time increases cost. Further, at a higher temperature, there may be some uncertain factors causing diffusion of P into the first silicon film 43, such as trapping of the element due to defects. Therefore, it is considered the most appropriate to perform the heat treatment for gettering Ni as a catalytic metal element at a temperature in the range of 400–600° C. for 4 to 12 hours.

(B) Method of Removing the Upper, Second Silicon Film Containing the Group V Element It is to be noted that in the method of producing a semiconductor device according to this invention, the upper, second silicon film containing the group V element and the catalytic metal element must be removed after gettering.

As a method of removing the second silicon film containing the group V element and the catalytic metal element, it is conceivable to remove the second silicon film alone by selective etching. However, since the first and second silicon films are both silicon films, it is impossible to selectively remove the second silicon film alone using selective etching. For that reason, as the method of removing the second silicon film, dry etching, the time for which is determined beforehand, may be employed. The etching time may be set such that the whole second silicon film and a part of the first silicon film under the second silicon film are etched.

When performing the dry etching for a predetermined time to remove the second silicon film, there is a possibility that the uniformity in film thickness of the first silicon film after the etching is deteriorated. In order to solve this problem, the ratio in film thickness of the lower, first silicon film to the upper, second silicon film may be increased. What ratio of film thicknesses is required is determined in the following manner.

First, suppose that the film thickness of the upper second silicon film is 1, and that the film thickness of the lower first silicon film is X. As general numerical values for dry etching, the in-plane distribution and the overetching time are set to 10% and +30%, respectively. When completely etching the upper second silicon film under these conditions, the average film thickness to be etched is 1.3, and the film thickness that is most etched is: 1.3×1.1=1.43. The difference between these film thicknesses is: 1.43−1.3=0.13. Incidentally, after completely removing the second silicon film by dry etching, the film thickness uniformity, namely flatness, required for the remaining first silicon film is within 5%. Accordingly, there is no problem if the above-mentioned difference in film thickness, i.e., 0.13, is within 5% of the film thickness of the first silicon film. Taking account of the film thickness of 0.3 that is to be overetched, a condition for placing the film thickness difference of 0.13 within 5% of the film thickness of the first silicon film is expressed as follows:

$$0.13 \div (X-0.3) < 0.05.$$

From this numerical formula, the value of the film thickness X is calculated to be X>2.9. That is, the ratio in film thickness of the first silicon film to the second silicon film is found to be about 3:1. Therefore, by making the film thickness of the second silicon film not more than one third of that of the first silicon film, the film uniformity, or flatness of the first silicon film can be maintained favorably even if the second silicon film is removed by dry etching.

In one embodiment, the second silicon film is formed by a vapor phase growth method. In this case, it is unnecessary to separately provide the step of adding the group V element. Accordingly, the number of production steps does not increase, and thus the production cost can be reduced.

For a further gettering of atoms of the catalytic metal element that may remain in the first silicon film, the method of the invention may further comprise, after the step of removing the second silicon film:

forming an oxide film on the first silicon film;

subjecting the first silicon film and the oxide film to a heat treatment to thereby getter the catalytic metal element that remains in the first silicon film to the oxide film; and removing the oxide film.

In order to effectively getter the catalytic metal element from the first silicon film to the oxide film, it is preferable that the heat treatment for the first silicon film and the oxide film is conducted in an oxidizing atmosphere containing at least one halogen and at a temperature of 700–1150° C.

The method of the present invention realizes a semiconductor device having a high-quality crystalline silicon film superior in crystal orientation and flatness with extremely few impurities and defects such as pin holes at low cost, and with high productivity and high yield. Thus, if the first silicon film is used for forming an active region of a TFT as the semiconductor device, high-performance of the TFT such as high-speed operation, low leak current, and low-voltage operation is realized. Using such high-performance TFTs, a highly functional active matrix liquid crystal display device, a contact type image sensor, a three-dimensional IC and the like, which have a reduced size, can be realized.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail according to the embodiment shown in the figures.

FIGS. 1A–1L are views showing the fabrication steps of a TFT as a semiconductor device according to one embodiment of this invention. The fabrication steps sequentially proceed in the order of the figure numbers 1A to 1L. The TFT is produced by the following steps.

(1) First, on a quartz substrate 11 as a substrate having an insulating surface, an a-Si film 12 is deposited to a thickness, for example, of 65 nm by an LPCVD (low pressure chemical vapor deposition) method. At this time, for example, $Si_2H_6$ (disilane gas) is used as a source gas, and the a-Si film 12 is formed under the conditions of a temperature of 450° C. and a pressure of 50 Pa.

Figure 1A:
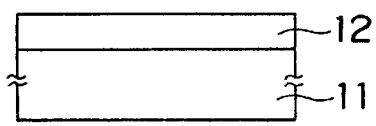
FIGS. 1A, 1B, 1C, 1D, 1E, 1F, 1G, 1H, 1I, 1J, 1K and 1L are views showing the fabrication steps of a TFT as a semiconductor device according to one embodiment of the present invention.
Figure 1B:
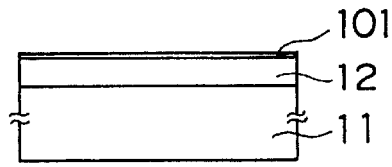

(2) Next, an aqueous solution in which $Ni(CF_3COO)_2$ (nickel acetate) is dissolved at a concentration of 10 ppm is spin-coated on the whole surface of the a-Si film 12 to add the element of Ni 101 as a catalytic metal element, which promotes crystallization of Si, to the surface of the a-Si film 12, as shown in FIG. 1B. The concentration of Ni at the surface of the a-Si film 12 is set to about $1\times10^{13}$ atoms/cm$^2$, for example. Further, as a method of adding the Ni 101 to the a-Si film 12, a sputtering method, a CVD method, a plasma treatment method, a vapor deposition method and the like may be used.

Figure 1C:
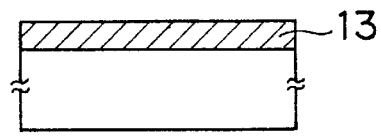

(3) Then, heat treatment is performed at 600° C. in a nitrogen atmosphere for 12 hours to crystallize the a-Si film 12, thus forming a CGS film 13 shown in FIG. 1C as a first silicon film. At this time, the CGS film 13 contains Ni. The Ni concentration in the CGS film 13 was analyzed by inductive coupling plasma mass spectrometry, and found to be $1.5\times10^{18}$ atoms/cm$^3$.

Figure 1D:
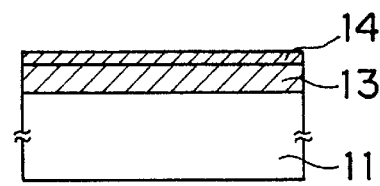

(4) Subsequently, an a-Si film 14 as a second silicon film containing a group V element P at a high concentration is formed on the CGS film 13 containing Ni, as shown in FIG. 1D. The a-Si film 14 is formed by mixing a gas containing Si and a gas containing P. By thus doing, it is unnecessary to additionally provide a step of adding a group V element. Thus, the production cost can be reduced.

Also, at this time, the concentration of P in the a-Si film 14 is set to $1\times10^{21}$ atoms/cm$^3$, and the film thickness of the a-Si film 14 is set to one third or less of the film thickness of the CGS film 13 (65 nm), namely, less than about 22 nm. Further, in the present embodiment, the film thickness of the a-Si film 14 is set to 10 nm.

Figure 1E:
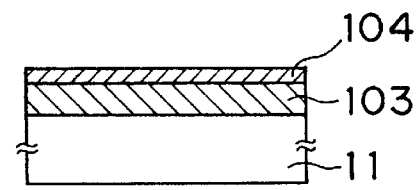

(5) Next, the heat treatment at a temperature of 400–600° C. is carried out for 4–12 hours for the gettering of Ni in the CGS film 13 to the a-Si film 14 containing P at a high concentration. As a result, as shown in FIG. 1E, the CGS film 13 and the a-Si film 14 become a CGS film 103 having a reduced amount of Ni within the film and an a-Si film 104 containing Ni and P, respectively.

By performing the heat treatment at a temperature in the range of 400–600° C., the diffusion of P from the a-Si film 14 to the CGS film 13 can be prevented, and also Ni within the CGS film 13 can sufficiently be gettered. In contrast, if the temperature of the heat treatment exceeds 600° C., atoms of P will be diffused into the CGS film 13. Thus, if the CGS film 13 containing P is used to fabricate a TFT, the CGS film adversely affects the properties of the TFT. On the other hand, if the temperature of the heat treatment is less than 400° C., the NI within the CGS film 13 is not sufficiently gettered, and thus heat treatment for longer hours is required, resulting in an increase in the production cost.

Further, performing the heat treatment in the range between 4 and 12 hours allows an effective gettering of the Ni within the CGS film 13. If the heat treatment is performed for less than 4 hours, the Ni within the CGS film cannot sufficiently be gettered. Also, the heat treatment for a long time exceeding 12 hours will result in an increase in the production cost.

Figure 1F:
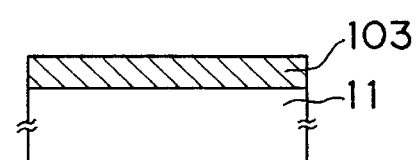

(6) Then, as shown in FIG. 1F, the a-Si film 104 containing Ni and P (shown in FIG. 1E) is removed by dry etching technique. At this time, the CGS film 103 may be overetched to some extent, but because the film thickness of the a-Si film 104 is not larger than one third of the film thickness of the CGS film 103 as shown in FIG. 1E, the uniformity in thickness of the CGS film 103 is maintained favorably.

Figure 1G:
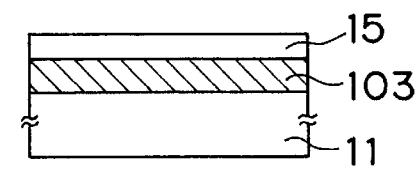

(7) Next, as shown in FIG. 1G, a first oxide film 15 having a film thickness of 30 nm is formed on the surface of the CGS film 103 in an atmosphere of $O_2$ at 950° C. This step is referred to as a second gettering process, which has an effect of further removing Ni atoms from the CGS film 103. In the second gettering process, if the heat treatment is performed in an oxidizing atmosphere containing at least one halogen, such as HCl, HF, HBr, $Cl_2$, $F_2$, and $Br_2$, nickel atoms within the CGS film 103 can be reduced more effectively. The temperature at this time is preferably within the range of 700–1150° C. As the temperature gets closer to 1150° C, the diffusion of Ni into the first oxide film 15 is promoted, thus enhancing an effect of gettering Ni.

Figure 1H:
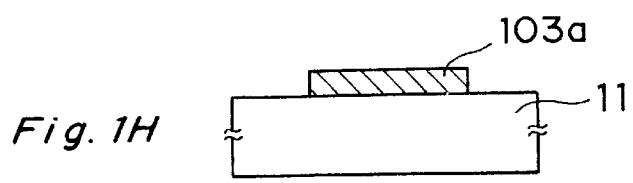

(8) After removing the first oxide film 15 using buffered hydrofluoric acid, patterning is performed using ordinary photolithography and dry etching technique such that a portion that is to become an active region of the TFT remains, as shown in FIG. 1H. As a result, a patterned CGS film 103a is formed on the quartz substrate 11.

Figure 1I:
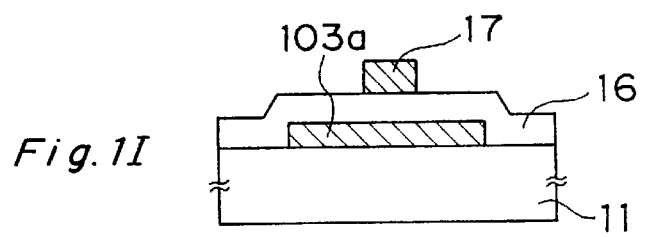
Figure 1J:
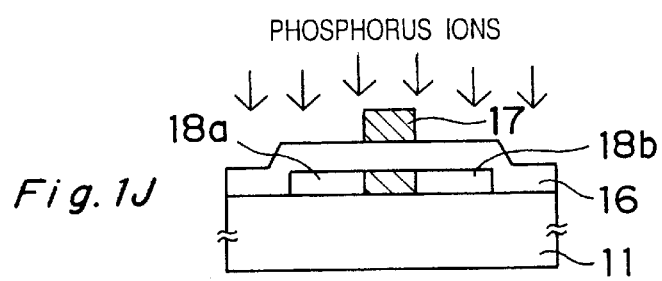

(9) On the patterned CGS film 103a is formed a second oxide film 16 as a gate insulating film to a thickness of 80 nm by the CVD method, as shown in FIG. 1I. Then, a p-Si film is deposited to a thickness of 300 nm by the CVD method. The resultant p-Si film is pattered using ordinary photolithography and dry etching technique to form a gate electrode 17;

(10) As shown in FIG. 1J, using the gate electrode 17 as a mask, P ions are implanted at a concentration of about $2 \times 10^{15}$ atoms/$cm^2$ to the CGS film 103 to form a source region 18a and a drain region 18b.

Figure 1K:
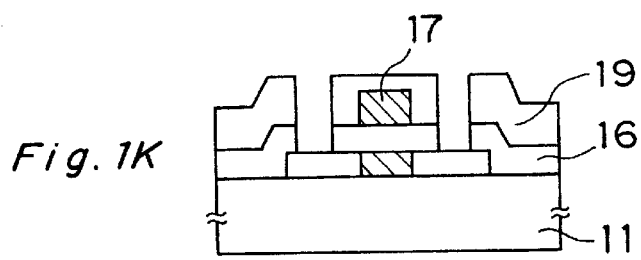

(11) As shown in FIG. 1K, on the whole surfaces of the second oxide film 16 and the gate electrode 17 is formed a third oxide film 19 as an interlayer insulating film to a thickness of 600 nm using the CVD method. After performing the heat treatment at 950° C. in a nitrogen atmosphere for 30 minutes for the purpose of activating impurities that have been ion-implanted, the second and third oxide films 16, 19 are formed with contact holes using ordinary photolithography and dry etching.

Figure 1L:
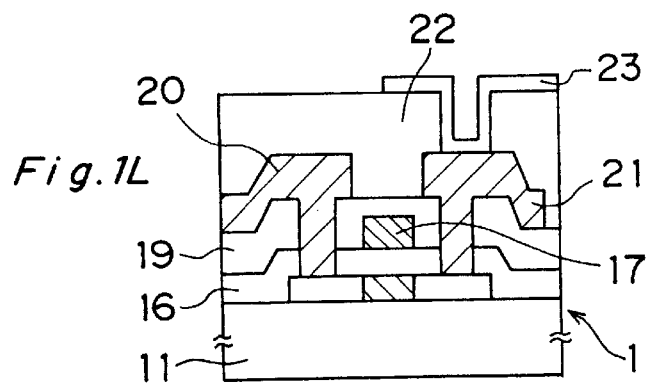
Figure 2:
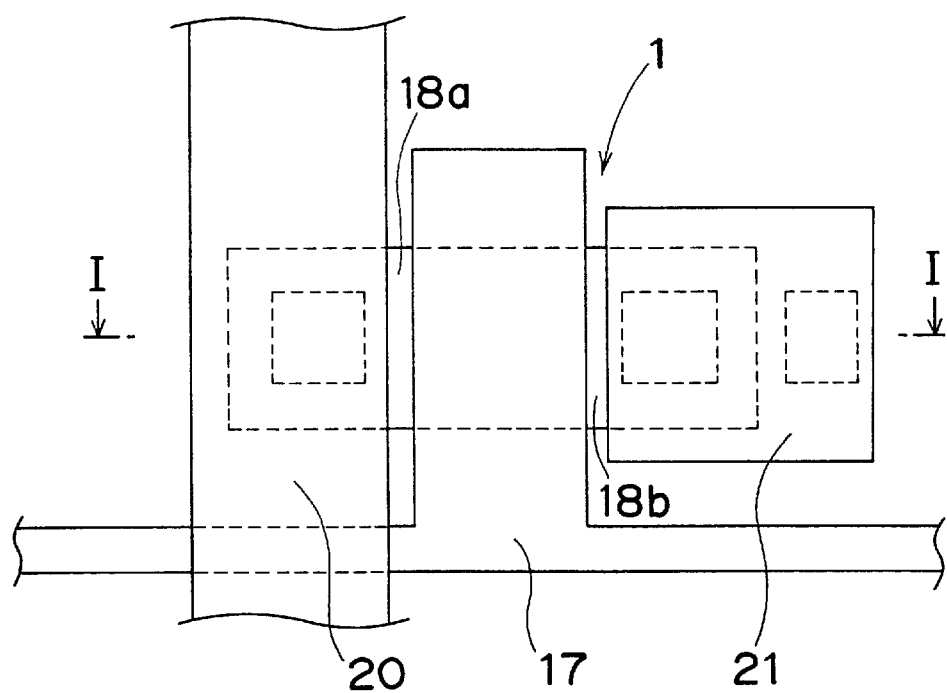
FIG. 2 is a view of the TFT seen from above.
Figure 3:
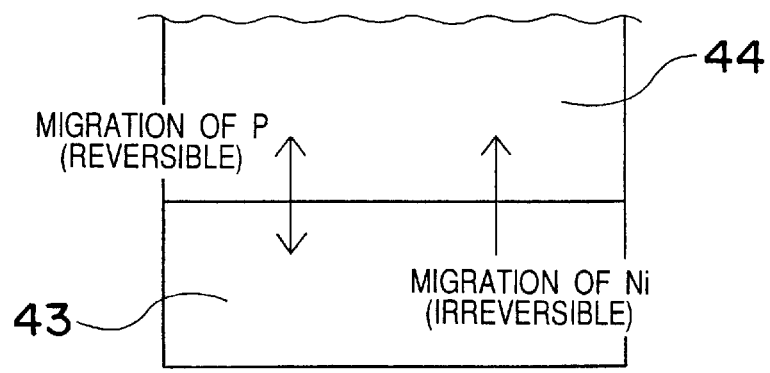
FIG. 3 is a conceptual diagram for describing the simulation of diffusion of P and gettering of Ni.
Figure 4:
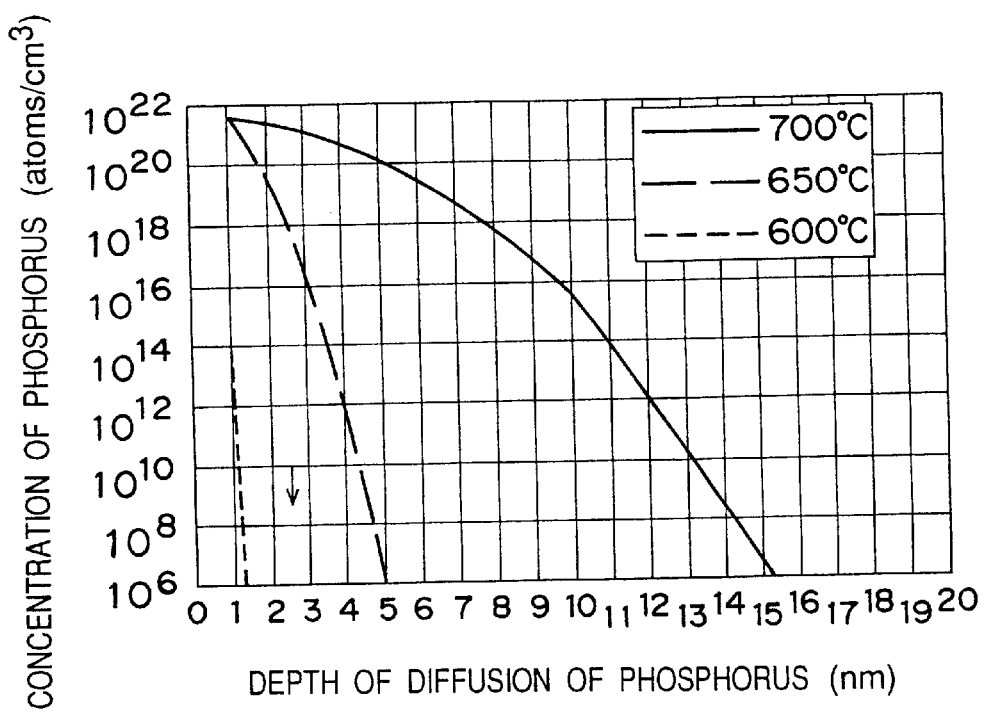
FIG. 4 is a graph showing the relationship between the concentration of P and the diffusion depth of P.
Figure 5:
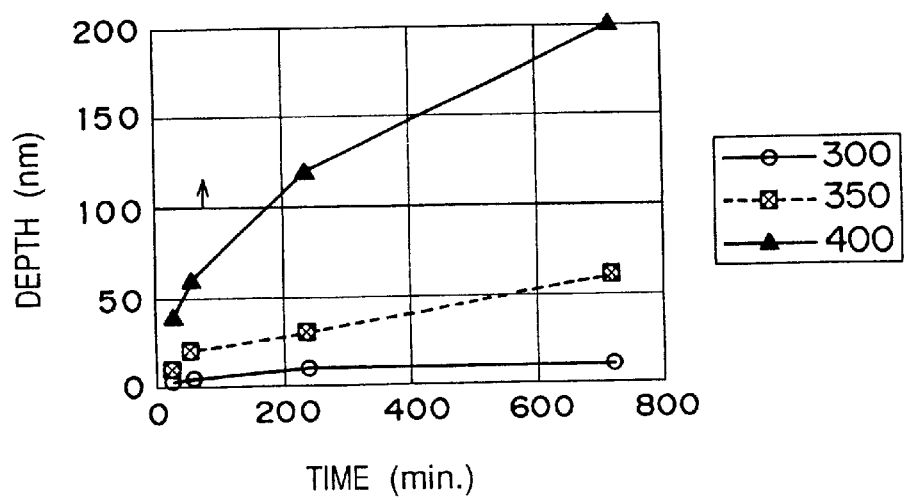
FIG. 5 is a graph showing the relationship between the time required for the Ni concentration to be $10^{10}$ atoms/cm$^3$ or higher and the depth.

(12) Lastly, after sequentially depositing an AlSi film, a nitride film and a transparent conducting film (ITO) to a thickness of 400 nm, 400 nm and 80 nm, respectively, photolithography and dry etching processes are performed to complete a TFT 1 shown in FIG. 1L. The TFT1 has a source electrode wiring 20 and a drain electrode wiring 21 each formed from the AlSi film, a protective film 22 formed from the nitride film, and a picture element electrode 23 formed from the transparent conducting film. When viewed from above, the TFT1 is in a state as shown in FIG. 2. In FIG. 2, some films are omitted for the sake of easy understanding.

As obvious from above, since the gettering is conducted using the second silicon film 14 directly formed on the whole surface of the first silicon film 13, instead of using parts of the first silicon film 13, the gettering process requires no mask, and hence no photolithography step for forming a mask. Therefore, the fabrication steps are simplified whereby the production cost can be reduced.

Further, after removing the a-Si film 104 to which Ni contained in the CGS film 13 has been gettered, Ni and P as impurities are not present in the CGS film 103, and no unusable regions exist in the CGS film 103. Therefore, there is no limitation in the layout of picture elements and drive elements, so that the size of an apparatus having the TFTs 1, such as an active matrix type LCD, can be reduced.

Further, the TFT 1 of the present embodiment is one example of the semiconductor device fabricated according to the invention, and thus the material, film thickness, formation method and the like are not limited to the above, except for those described in the claims.

Further, although the CGS film 13 was obtained by adding Ni to the a-Si film 12 and conducting heat treatment in the above embodiment, a partially crystalline amorphous silicon film may be used in place of the amorphous silicon film 12.

Further, although Ni was used as a catalytic metal element in the above embodiment, at least one metal element selected from the group consisting of Fe, Co, Ni, Cu, Ru, Rh, Pd, Os, Ir, Pt and Au may be used.

Also, one or more other group V elements may be used in place of phosphorus.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a semiconductor device, the method comprising:

crystallizing an amorphous silicon film or a partially crystalline amorphous silicon film using a catalytic metal element promoting crystallization of silicon to form a crystalline first silicon film;

forming a second silicon film containing a group V element directly on an entire surface of the first silicon film;

subjecting the first silicon film and the second silicon film to a heat treatment to thereby getter at least some of the catalytic metal element from the first silicon film to the second silicon film; and removing the second silicon film to which the catalytic metal element has been gettered.

2. The method of producing a semiconductor device according to claim 1, utilizing at least one element selected from a group consisting of Fe, Co, Ni, Cu, Ru, Rh, Pd, Os, Ir, Pt and Au as the catalytic metal element.

3. The method of producing a semiconductor device according to claim 1, wherein the group V element contained in the second silicon film is phosphorus.

4. The method of producing a semiconductor device according to claim 1, wherein the step of forming a second silicon film comprises mixing a gas containing silicon and a gas containing the group V element to form the second silicon film by a vapor phase growth method.

5. The method of producing a semiconductor device according to claim 1, wherein the heat treatment to getter the catalytic metal element is carried out at a temperature in a range of 400° C.–600° C.

6. The method of producing a semiconductor device according to claim 1, wherein the heat treatment to getter the catalytic metal element is carried out for 4–12 hours.

7. The method of producing a semiconductor device according to claim 1, wherein the second silicon film is formed to a thickness of one third of that of the first silicon film or less.

8. The method of producing a semiconductor device according to claim 7, wherein the step of removing the second silicon film utilizes a dry etching process.

9. The method of producing a semiconductor device according to claim 1, wherein, after the step of removing the second silicon film, the method further comprises:

forming an oxide film on the first silicon film;

subjecting the first silicon film and the oxide film to a heat treatment to thereby getter further catalytic metal element that remains in the first silicon film from the first silicon film to the oxide film; and removing the oxide film.

10. The method of producing a semiconductor device according to claim 9, wherein the heat treatment for the first silicon film and the oxide film is conducted in an oxidizing atmosphere containing at least one halogen and at a temperature of 700–1150° C.

11. The method of producing a semiconductor device according to claim 1, wherein the first silicon film is used for forming an active region of the semiconductor device.

* * * * *